United States Patent [19]

Bailey

[11] Patent Number: 4,710,890

[45] Date of Patent: Dec. 1, 1987

[54] BALANCED MIXER

[75] Inventor: George Bailey, Montgomery County, Md.

[73] Assignee: Hekimian Laboratories, Inc., Gaithersburg, Md.

[21] Appl. No.: 772,870

[22] Filed: Sep. 5, 1985

[51] Int. Cl.$^4$ ............................................. H03B 19/00
[52] U.S. Cl. ................................... 364/703; 307/529; 328/14; 328/160
[58] Field of Search ................. 328/14, 143, 142, 158, 328/159, 160; 307/529; 364/703

[56] References Cited

U.S. PATENT DOCUMENTS

| | | | |
|---|---|---|---|
| 3,992,680 | 11/1976 | Herzl | 328/14 |
| 4,056,692 | 11/1977 | Place | 328/14 |
| 4,061,909 | 12/1977 | Bryant | 328/14 |
| 4,109,208 | 8/1978 | Tomisawa et al. | 328/14 |
| 4,349,887 | 9/1982 | Crowley | 328/14 |
| 4,446,436 | 5/1984 | Ireland | 328/14 |
| 4,524,326 | 6/1985 | Larson | 328/14 |

Primary Examiner—John S. Heyman
Attorney, Agent, or Firm—Brumbaugh, Graves, Donohue & Raymond

[57] ABSTRACT

A balanced mixer for mixing a discrete approximation of a periodic, continuous signal with a periodic digital signal includes a Johnson counter providing a set of discrete signals suitable for generating a discrete approximation of the continuous signal by appropriately weighting and summing such discrete signals, a resistive weighting and summing network comprising a plurality of weighting resistors corresponding to the discrete signals and having one terminal connected to a summing node, and a plurality of EXCLUSIVE OR gates, each having one input connected to receive a respective one of the discrete signals, another input connected to receive the digital signal to be mixed and an output connected to the other terminal of the weighting resistor corresponding to the discrete signal received by the EXCLUSIVE OR gate. The circuit may be extended to mix two or more discrete approximations of periodic, continuous signals by providing a Johnson counter for each discretely approximated signal to be mixed and a multiplicity of single or plural level EXCLUSIVE OR gates, each having its inputs connected to receive a different combination of one discrete signal from each Johnson counter and its output connected to one terminal of a respective weighting resistor. The other terminal of the weighting resistors are connected to a summing node. The value of the weighting resistor connected to each EXCLUSIVE OR gate is determined by taking the product of the resistor values that would be used to appropriately weight the discrete signals received by the EXCLUSIVE OR gate to generate the signals to be mixed.

9 Claims, 14 Drawing Figures

BALANCED MIXER

BACKGROUND OF THE INVENTION

The present invention relates to balanced mixers for multiplying a plurality of signals to derive the product thereof and, more particularly, to balanced mixers for multiplying signals generated by discrete approximation.

Balanced mixers are known in the art and are widely used in signal generation and signal detection equipment. An example of the function of a balanced mixer is where two pure sine waves of frequencies $\omega_1$ and $\omega_2$ are multiplied by the mixer to provide a mixer product signal having components at the sum and difference, $\omega_1 + \omega_2$ and $|\omega_2 - \omega_1|$, respectively, of the frequencies of the sine waves being mixed.

In signal generation equipment, such as frequency synthesizers, the signals to be mixed are frequently approximated by discrete signals to simplify the generation process. For example, a sine wave may be approximated to first order by a square wave of the same frequency. More accurate approximations of continuous, periodic signals may be achieved by using a weighted superposition of multiple discrete signals, such as square waves, having appropriate phase delays. The circuits used to provide such discrete approximations of periodic, continuous signals are known and generally include a counter circuit for providing a set of discrete (digital) signals having appropriate phase relationships between one another and a weighting and summing network for assigning an appropriate weight to each discrete signal and adding each weighted signal to derive the approximated signal. Therefore, the mixing of discrete approximations of signals involves the mixing of weighted discrete signals (i.e., weighted digital signals that have only two discrete levels).

Digital signals are most appropriately mixed by an EXCLUSIVE NOR gate, which is the digital equivalent of the balanced mixer. An EXCLUSIVE OR gate will serve equally well as a mixer for digital signals, with the only difference being an inconsequential phase reversal in the output signal provided by the gate. Owing to the simplicity of construction of the EXCLUSIVE NOR and EXCLUSIVE OR gates, when compared with that of the conventional diode bridge balanced mixer, it would be highly advantageous to use such components in a balanced mixer for signals that are approximated by weighted digital signals.

In a typical heterodyne synthesizer arrangement, the frequencies $\omega_1$ and $\omega_2$ of the signals being mixed are selected such that the difference between those frequencies $|\omega_1 - \omega_2|$ is equal to the desired synthesis frequency $\omega_0$ and that $\omega_1$ and $\omega_2$ are both substantially higher than $\omega_0$.

Ordinarily, a low-pass filter having a cutoff frequency $\omega_0$ is required to suppress the unwanted components of the mixer product signal, at least the component at the sum frequency $\omega_1 + \omega_2$. The difficulty of implementing such a low-pass filter depends on such factors as the closeness of the frequencies $\omega_1$ and $\omega_2$ to the synthesized frequency $\omega_0$, the required spectral purity of the synthesized signal and the accuracy with which the mixer function approximates true multiplication of input signals.

Figure 1:
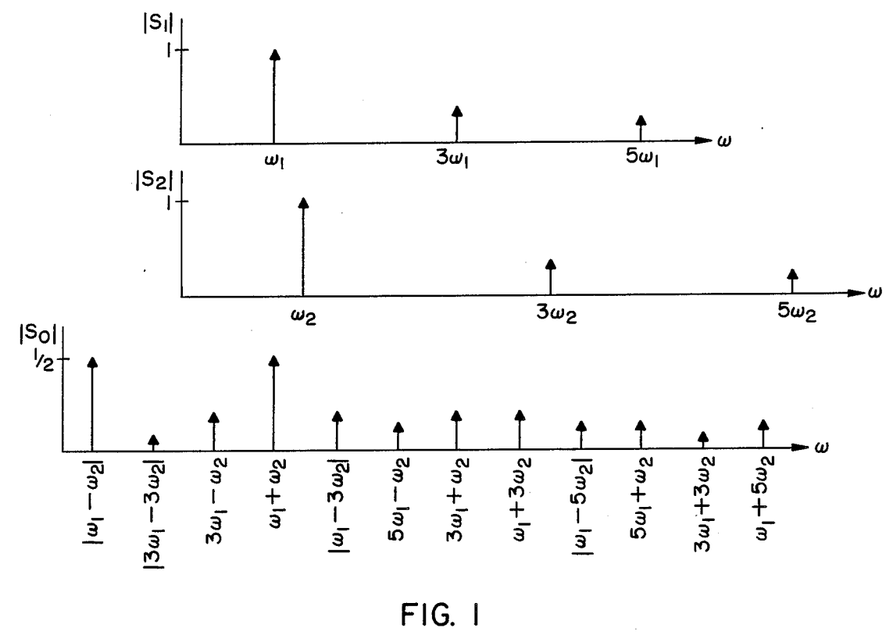
FIG. 1 graphically illustrates the spectral components of square wave input signals $S_1$ and $S_2$ and the mixer product $S_0$ of those signals. Only the first three Fourier components of $S_1$ and $S_2$ are considered.
Figure 2:
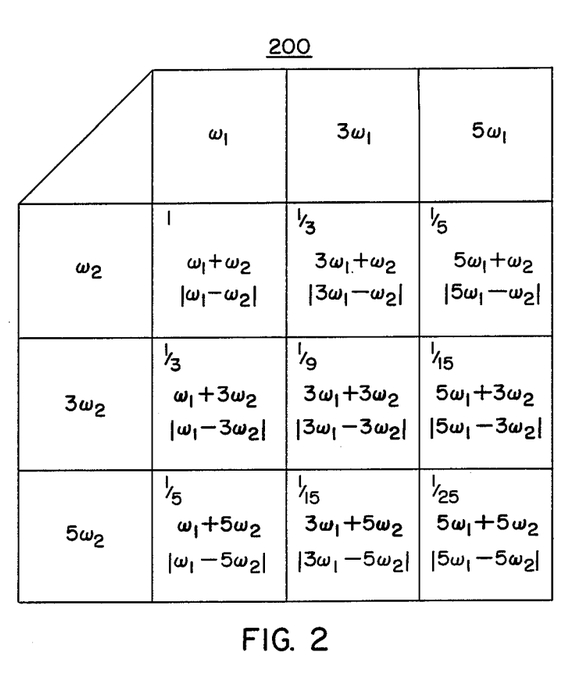
FIG. 2 is a mixing chart tabulating the spectral components illustrated in FIG. 1.

The mixing of two square waves $S_1$ and $S_2$ having frequencies $\omega_1$ and $\omega_2$, respectively, by an EXCLUSIVE OR gate to obtain a product signal $S_0$ is graphically illustrated in FIG. 1, which shows graphs of the amplitudes $|S_1|$, $|S_2|$ and $|S_0|$ of the input signals $S_1$ and $S_2$ and the product signal $S_0$, respectively, versus frequency $\omega$. The spectral distribution of the product signal $S_0$ is derived by making a Fourier series expansion of the input signals $S_1$ and $S_2$ and multiplying the Fourier components of one input signal with those of the other. For simplicity of illustration, the graph of $|S_0|$ versus frequency $\omega$ in FIG. 1 takes into account only the first three Fourier components of $S_1$ and $S_2$. A mixing chart 200 tabulating the frequencies and the relative amplitudes of the various products of the first three Fourier components of $S_1$ and $S_2$ is shown in FIG. 2. Each block of the mixing chart 200 contains the sum and difference frequencies resulting from the multiplication of the Fourier components corresponding to the row and column in which the block is situated. The number at the upper left corner of each block denotes the relative amplitude of the components within the block.

As is apparent from the graph of $|S_0|$ versus frequency $\omega$ in FIG. 1, the output signal from an EXCLUSIVE OR gate mixer contains numerous and powerful unwanted spectral components. As such, burdensome requirements are placed on the low-pass filter to reject the unwanted components. In general, the most troublesome unwanted components in the mixer product $S_0$ are those having frequencies $n|\omega_1 - \omega_2|$ and corresponding relative amplitudes $1/n^2$. Since the desired component of the mixer product $S_0$ has frequency $|\omega_1 - \omega_2|$, these undesired components of $S_0$ for $n \neq 1$ appear as the harmonics of the desired component.

In the example illustrated in FIG. 1, the first unwanted harmonic component in the mixer product $S_0$ is $n=3$ having a relative amplitude of 1/9. If a fixed-cutoff-frequency low-pass filter is used to reject all unwanted harmonics, it must have a cutoff frequency $\omega_C$ that is less than three times the lowest synthesis frequency $\omega_L$. However, the use of such a filter also limits the highest synthesis frequency $\omega_H$ to be less than $\omega_C$ and the ratio of the highest to lowest synthesis frequency $\omega_H/\omega_L$ to less than three. Consequently, the use of the EXCLUSIVE OR gate as the mixer not only imposes burdensome requirements on the low-pass filter for removing the unwanted components in the mixer product but also severely restricts the frequency tuning range of the synthesizer.

Figure 3:
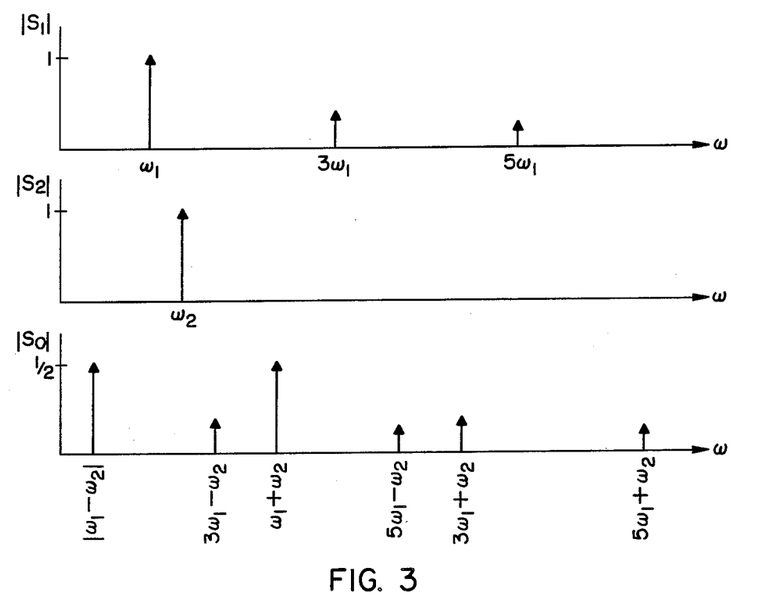
FIG. 3 graphically illustrates the spectral components of a square wave signal $S_1$, a sinusoidal signal $S_2$ and the mixer product $S_0$ of those signals. Only the first three Fourier components of $S_1$ are considered.
Figure 4:
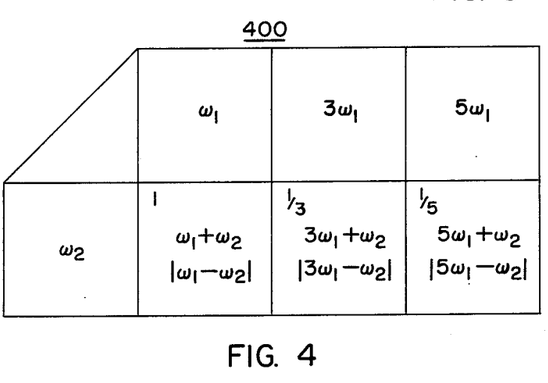
FIG. 4 is a mixing chart tabulating the spectral components illustrated in FIG. 3.

An alternative approach which imposes less stringent filtering requirements for the removal of unwanted components of the mixer product while still taking advantage of the digital properties of discretely approximated signals is to mix a two step approximation, i.e., a square wave, with a pure sine wave. The mixing of a square wave signal $S_1$ of the frequency $\omega_1$ and a sine wave signal $S_2$ of frequency $\omega_2$ to provide a mixer product signal $S_0$ is graphically depicted in FIG. 3, which shows graphs of the amplitudes $|S_1|$, $|S_2|$ and $|S_0|$ of those signals versus frequency $\omega$. The mixer product signal $S_0$ is derived by expanding the square wave signal $S_1$ in a Fourier series and by multiplying each of the Fourier components of $S_1$ by the sine wave signal $S_2$. For simplicity of illustration, the graphs of $|S_1|$ and $|S_0|$ versus frequency take into account only the first three Fourier components of the signal $S_1$. A mixing chart 400 tabulating the frequencies and relative amplitudes of the various products of the first three Fourier components of $S_1$ and $S_2$ is shown in FIG. 4. From the graph of $|S_0|$ versus frequency in FIG. 4, it may be noted that when the square wave $S_1$ is mixed with the sine wave $S_2$, the separation between the nearest unwanted component of the mixer product signal $S_0$ at frequency $3\omega_1 - \omega_2$ and the desired component at frequency $|\omega_1 - \omega_2|$ is much greater than in the case where two square waves are mixed. As such, the filtering requirements for removing the unwanted components of the mixer product are more easily met, and the desired component of the mixer product signal can have a wider frequency tuning range.

Figure 5:
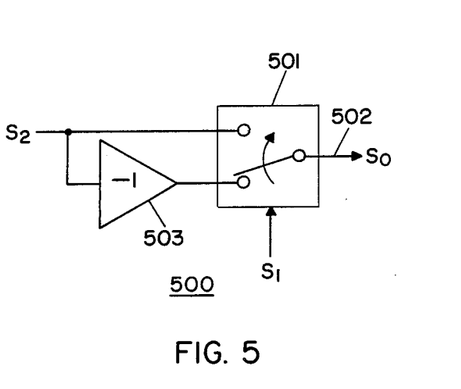
FIG. 5 is a schematic diagram illustrating a mixer circuit for mixing a digital signal $S_1$ and an analog signal $S_2$.

However, the mixing of a discretely approximated signal with a purely sinusoidal signal has the drawback in that a mixer for such signals is difficult to realize. The multiplication of a digital signal with a sinusoidal signal may be done with a special mixer which is schematically illustrated in FIG. 5. Referring to FIG. 5, the mixer 500 includes an analog switch 501, which is responsive to the digital signal $S_1$ for coupling either the sinusoidal signal $S_2$ or its inverse to the mixer output 502, depending on whether the digital signal is at a "1" or a "0" logic level, respectively. The circuit of FIG. 5 is difficult to implement in that it requires a nearly ideal analog switch 501 and inverting amplifier 502 in order to achieve a high degree of suppression of the input signals $S_1$ and $S_2$ and to provide a good approximation of true multiplication of those signals.

Accordingly, a need clearly exists for a balanced mixer for discretely approximated signals which can be implemented primarily with digital components and which provides a desired mixer product component that is well separated from unwanted components so as to facilitate the removal of the unwanted components by filtering and to allow the desired component be tuned over a wide frequency range.

SUMMARY OF THE INVENTION

The foregoing and other disadvantages of the prior art are overcome and the aforementioned need is fulfilled, in accordance with the present invention, by including in combination with the counter for providing the digital signals used to generate the discrete approximations of the signal to be mixed, a plurality of EXCLUSIVE OR gates that mix each of the digital signals generated by the counter with another digital signal or signals to be mixed. The other digital signals may be those provided by another counter to be used for generating a discrete approximation of a second signal to be mixed. The outputs of the EXCLUSIVE OR gates are appropriately weighted and summed by a weighting and summing network to obtain the mixer product signal.

In one exemplary embodiment of the invention for mixing a discretely approximated, periodic, continuous signal with a periodic digital signal, the mixer comprises a Johnson counter having a multiplicity of stages with outputs for providing a set of digital signals suitable for use in generating the discretely approximated signal to be mixed. The mixer further comprises a plurality of 2-input EXCLUSIVE OR gates, each having one of its inputs connected to the output of a respective stage of the Johnson counter and the other of its inputs connected to receive the digital signal to be mixed. The outputs of the EXCLUSIVE OR gates are connected to a resistive weighting and summing network that is the same as would be used with the Johnson counter to form an ordinate generator for providing the discretely approximated signal to be mixed. Where the discrete approximating signal is symmetric about its half-period point, one of the stages of the Johnson counter can be left unconnected (i.e., treated as inoperative) and the EXCLUSIVE OR gate and weighting resistance corresponding to that stage eliminated.

In another exemplary embodiment of the invention for mixing two or more discretely approximated, periodic, continuous signals, the mixer comprises a plurality of Johnson counters, each associated with a different one of the discretely approximated signals and having a multiplicity of stages with outputs for providing a set of digital signals suitable for use in generating the discretely approximated signal associated therewith. Preferably, the Johnson counters have differing numbers of stages so as to minimize the overlap of harmonics in the signals that are to be mixed. The mixer further comprises a multiplicity of EXCLUSIVE OR gates, each corresponding to a different combination of one operative output from each of the Johnson counters and having a multiplicity of inputs connected to respective outputs of the corresponding combination. The outputs of the EXCLUSIVE OR gates are connected to a resistive weighting and summing network comprising a multiplicity of weighting resistors, each connected to the output of a respective one of the EXCLUSIVE OR gates and having a value equal to the product of the values of the weighting resistors that would be connected to the outputs corresponding to the EXCLUSIVE OR gate, if each of the Johnson counters and the weighting resistors connected to the outputs thereof formed an ordinate generator for providing the discretely approximated signal associated with the Johnson counter. If the signal associated with a Johnson counter is symmetric about the half period point, one of the stages of the counter may be left unconnected (i.e., treated as inoperative), and the EXCLUSIVE OR gates and weighting resistors corresponding to combinations of outputs that include the output of the unconnected stage may be eliminated.

BRIEF DESCRIPTION OF THE DRAWING

The present invention may be better understood with reference to the following detailed description of the exemplary embodiments, taken in conjunction with the accompanying drawing, in which.

Throughout the figures of the drawing the same reference numerals and characters are used to denote like components, parts and features of the illustrated apparatus and signals.

DETAILED DESCRIPTION

Figure 6:
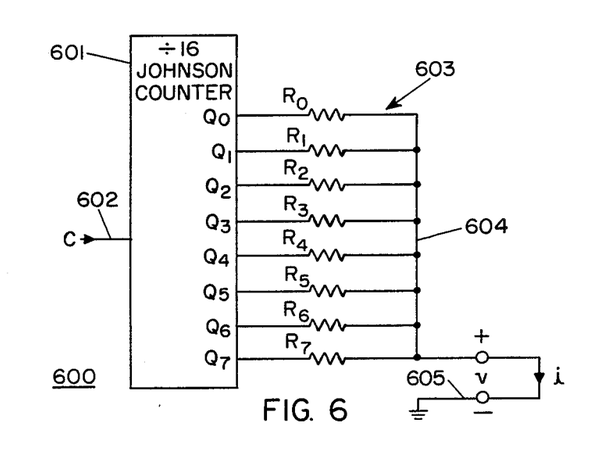
FIG. 6 is a schematic circuit diagram of a 16 ordinate generator constructed with an eight stage Johnson counter and an appropriate resistive weighting and summing network.

Referring now to FIG. 6, there is shown a schematic diagram of an ordinate generator 600 for providing a 16th order discrete approximation of a periodic, continuous signal. The ordinate generator 600 includes an eight-stage (divide-by-sixteen) Johnson counter 601 having eight sequentially-ordered outputs $Q_0-Q_7$ and a clock input 602. The ordinate generator 600 further includes a resistive weighting and summing network 603 comprising eight resistors $R_0-R_7$, each having one end connected to a respective one of the outputs $Q_0-Q_7$ and another end connected to a common node 604. The discretely approximated signal provided by the ordinate generator 600 is obtained either as a voltage v between the common node 604 and ground 605 or as a current i between the common node and ground. For purposes of value calculation, it is convenient to assume the limit case of short circuit current as the output.

Figure 7:
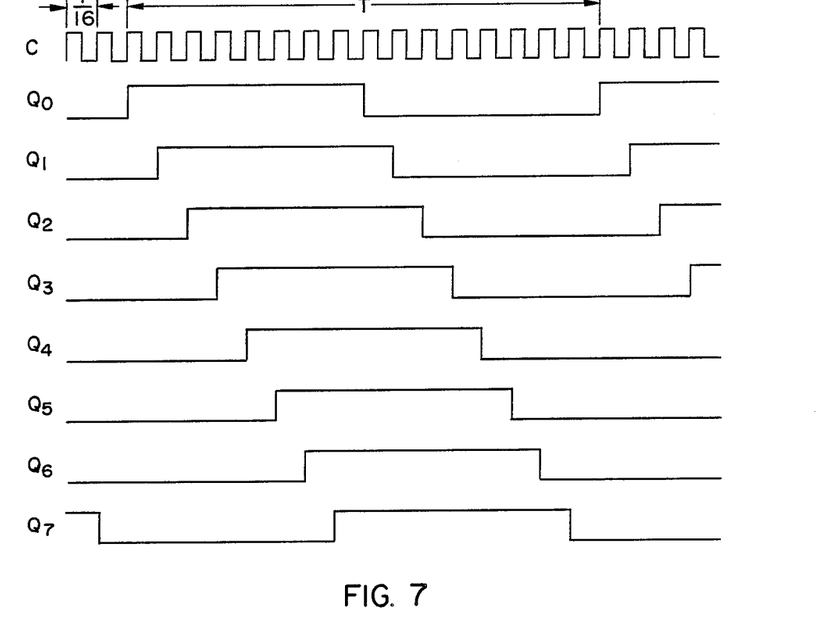
FIG. 7 graphically illustrates the clock signal and the output signals of the Johnson counter of FIG. 6.

The waveforms of signals provided by the outputs $Q_0-Q_7$ of the Johnson counter, when a square wave clock signal C is applied to its input 602, is depicted in FIG. 7. Each of the outputs $Q_0-Q_7$ provides a square wave signal having a period sixteen times greater than that of the clock signal C, and the signal from each output is delayed from that of the preceding output by the period of the clock signal. Note that $Q_0$ is delayed one clock period relative to $Q_7$. Thus the Johnson counter provides a set of discrete signals suitable for use in generating a stepwise approximation of certain continuous signals having the same period T as the discrete signals by appropriately weighting and summing such discrete signals with the resistive network 603. The waveform of the signal f(t) being approximated by the output signals of the Johnson counter must be always positive, and satisfy $f(t)=f(T/2)-f(t-T/2)$ for $T/2 \leq t < T$. Accordingly, all sinusoidal signals that have been d.c. shifted to be always positive can be approximated by a Johnson counter ordinate generator.

For a particular continuous signal being approximated, the values of the resistors $R_0-R_7$ in the weighting and summing network 603 may be derived by taking sixteen sample F(0)-F(15) of the signal at intervals of T/16. Recognizing that for a given output $Q_i$ connected to a weighting resistor $R_i$, the weighting and summing network 603 adds a current proportional to $1/R_i$ when $Q_i$ is in the "1" state and adds no current when $Q_i$ is in the "0" state, the following equations relating the values of resistor $R_0-R_7$ to the signal samples F(0)-F(15) are obtained:

$$F(0)=0, \tag{1}$$

$$F(1)=1/R_0, \tag{2}$$

$$F(2)=1/R_0+1/R_1, \tag{3}$$

$$F(3)=1/R_0+1/R_1+1/R_2, \tag{4}$$

$$F(4)=1/R_0+1/R_1+1/R_2+1/R_3, \tag{5}$$

$$F(5)=1/R_0+1/R_1+1/R_2+1/R_3+1/R_4, \tag{6}$$

$$F(6)=1/R_0+1/R_1+1/R_2+1/R_3+1/R_4+1/R_5, \tag{7}$$

$$F(7)=1/R_0+1/R_1+1/R_2+1/R_3+1/R_4+1/R_5+1/R_6, \tag{8}$$

$$F(8)=1/R_0+1/R_1+1/R_2+1/R_3+1/R_4+1/R_5+1/R_6+1/R_7, \tag{9}$$

$$F(9)=1/R_1 30\ 1/R_2+1/R_3+1/R_4+1R_5+1/R_6+1/R_7, \tag{10}$$

$$F(10)=1/R_2+1/R_3+1/R_4+1/R_5+1/R_6+1/R_7, \tag{11}$$

$$F(11)=1/R_3+1/R_4+1/R_5+1/R_6+1/R_7, \tag{12}$$

$$F(12)=1/R_4+1/R_5+1/R_6+1/R_7, \tag{13}$$

$$F(13)=1/R_5+1/R_6+1/R_7, \tag{14}$$

$$F(14)=1/R_6+1/R_7, \tag{15}$$

$$F(15)=1/R_7. \tag{16}$$

In the specific case where the signal being approximated is symmetric about T/2, such as a raised sinusoid, the samples F(1)-F(15) have the following symmetry relations: F(1)=F(15), F(2)=F(14), F(3)=F(13) and F(4)=F(12). Substituting the above symmetry relations in equations (1)-(16) and solving for the resistor values $R_0-R_7$, the following expressions are obtained:

$$R_0 = R_7 = \frac{1}{F(1)}, \tag{17}$$

$$R_1 = R_6 = \frac{1}{F(2) - F(1)}, \tag{18}$$

$$R_2 = R_5 = \frac{1}{F(3) - F(2)}, \tag{19}$$

$$R_3 = R_4 = \frac{1}{F(4) - F(3)}. \tag{20}$$

It is noted from equations (17)-(20) that the resistor values are "symmetric" and equal to the inverse of the difference between successive samples of the signal being approximated.

A similar derivation may be performed to obtain the expressions for the resistor values for a different order of approximation. In general, for an n th order approximation of a continuous, periodic signal, n samples of the signal are taken at intervals of $2\pi/n$, and at most n/2 independent expressions can be derived for the values of the resistors of the weighting and summing network.

Figure 8:
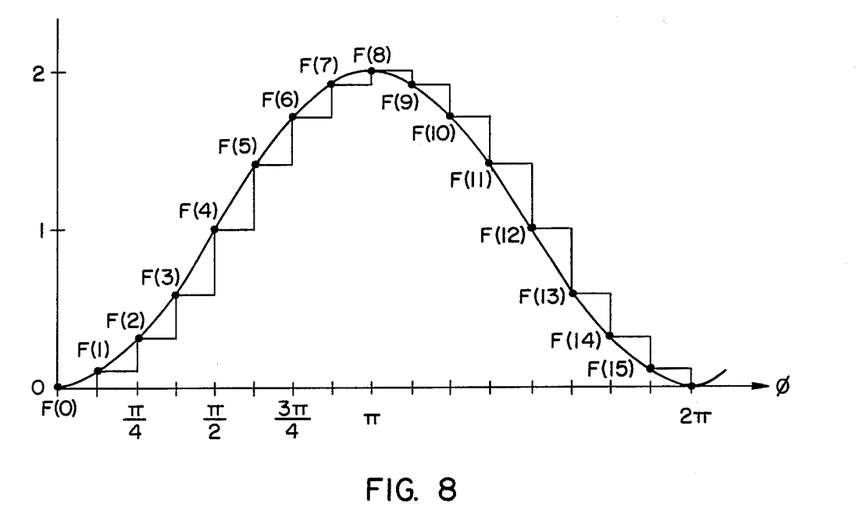
FIG. 8 graphically illustrates a 16th order discrete approximation of the signal $1-\cos\phi$ with the first step of the approximation beginning at $\phi=0$.

An example of a 16th order discrete approximation of the signal $1-\cos\phi$ ($\phi=\omega t$) is illustrated in FIG. 8. The first nine samples of the signal, taken at intervals of $\pi/8$ beginning with $\phi=0$, are tabulated in table 1.

TABLE 1

| $\phi$ | $1-\cos\phi$ | $\delta$ | $1/\delta$ | ratio |
|---|---|---|---|---|
| 0 | 0 | 0 | — | — |
| $\pi/8$ | .076120 | .076120 | 13.137 | 5.0274 |
| $\pi/4$ | .292893 | .216773 | 4.6131 | 1.7654 |
| $3\pi/8$ | .617317 | .324424 | 3.0824 | 1.1796 |
| $\pi/2$ | 1 | .382683 | 2.61313 | 1 |
| $5\pi/8$ | 1.382683 | .382683 | 2.61313 | 1 |
| $3\pi/4$ | 1.707107 | .324424 | 3.0824 | 1.1796 |
| $7\pi/8$ | 1.923880 | .216773 | 4.6131 | 1.7654 |
| $\pi$ | 2 | .076120 | 13.137 | 5.0274 |

Also tabulated in Table 1 are the values for the difference $\delta$ between successive samples and the values for the inverse thereof $1/\delta$. According to equations (17)–(20), the eight tabulated values of $1/\delta$ may be used as the values of the resistors $R_0$–$R_7$, respectively.

From the standpoint of proper operation of the weighting and summing network 603, the absolute values of the resistors $R_0$–$R_7$ are unimportant, since it is the ratios of the resistors in the network that determine the correct weighting of the signals being summed. Therefore, the values of the resistors $R_0$–$R_7$ are normalized to the lowest value of $1/\delta$ and tabulated as resistor ratios in Table 1. It should be noted that for a specific implementation of the ordinate generator of FIG. 6, the resistor ratios may be multiplied by an appropriate scale factor to meet design or fabrication requirements. It may be shown that the maximum value of the resistor ratio (i.e., the spread of the resistor ratios) for an approximation of $1-\cos\phi$, in which the lowest step value is selected to be zero, can be expressed as $\sin(2\pi/n)/[1-\cos(2\pi/n)]$, where n is the order of the approximation.

Figure 9:
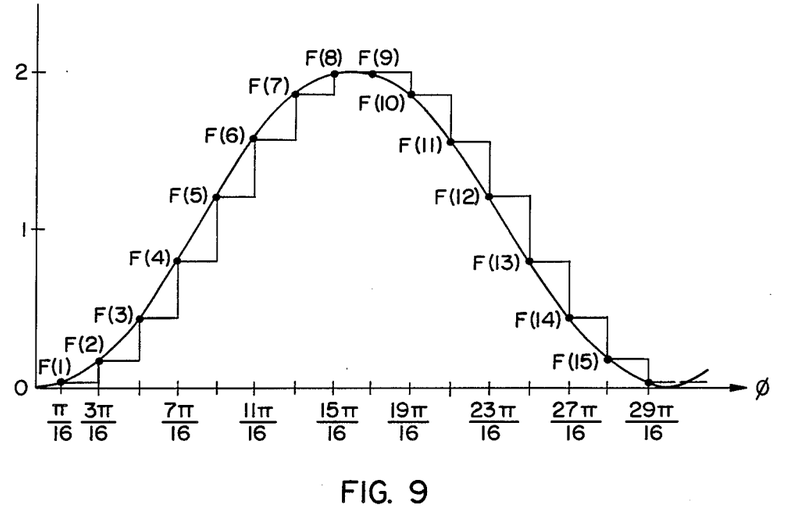
FIG. 9 graphically illustrates a 16th order discrete approximation of the signal $1-\cos\phi$ with the first step of the approximation beginning at $\phi=-\pi/16$.

Turning now to FIG. 9, there is shown another discrete approximation of the signal $1-\cos\phi$ using the set of discrete signals illustrated in FIG. 7. In the approximation of FIG. 9, however, the sampling points are shifted to the left by $\pi/16$ from those used in FIG. 8, i.e., the first sample F(0) is taken at $\phi=-\pi/16$. Because the first sampling point is no longer at $\phi=0$, the half-period symmetry of the signal, $1-\cos\phi$, now gives rise to the following relations: F(2)=F(15), F(3)=F(14), F(4)=F(13) and F(5)=F(12). Substituting these symmetry relations into equations (1)–(16), the following expressions for the resistor values $R_0$–$R_7$ are obtained:

$$R_0 = \frac{1}{F(1)}, \quad (21)$$

$$R_1 = R_7 = \frac{1}{F(2) - F(1)}, \quad (22)$$

$$R_2 = R_6 = \frac{1}{F(3) - F(2)}, \quad (23)$$

$$R_3 = R_5 = \frac{1}{F(4) - F(3)}, \quad (24)$$

$$R_4 = \frac{1}{F(5) - F(4)}. \quad (25)$$

Table 2 tabulates the samples F(1)–F(8) obtained at the sampling points shown in FIG. 9, the values of the difference between successive samples $\delta$ and the values of the inverse thereof, $1/\delta$.

TABLE 2

| $\phi$ | $1-\cos\phi$ | $\delta$ | $1/\delta$ | ratio |
|---|---|---|---|---|
| $\pi/16$ | .019215 | .019215 | 52.043 | |
| $3\pi/16$ | .168530 | .149315 | 6.6973 | 2.613 |
| $5\pi/16$ | .444430 | .275900 | 3.6245 | 1.414 |
| $7\pi/16$ | .804910 | .360480 | 2.7741 | 1.082 |
| $9\pi/16$ | 1.195090 | .390180 | 2.5629 | 1 |
| $11\pi/16$ | 1.555570 | .360480 | 2.7741 | 1.082 |
| $13\pi/16$ | 1.831470 | .275900 | 3.6245 | 1.414 |
| $15\pi/16$ | 1.980785 | .149315 | 6.6973 | 2.613 |

According to equations (21)–(25), the tabulated values of $1/\delta$ in Table 2 may be used as the values of resistors $R_0$–$R_7$, respectively, in the ordinate generator of FIG. 6 for providing a 16th order approximation of the signal $1-\cos\phi$. If instead of synthesizing $1-\cos\phi$, an additional d.c. offset term, $a$, is introduced such that the samples at $-\pi/16$ and $\pi/16$ are zero, i.e., subtract 0.019215 from each sample. The resistor $R_0$ associated with the first sample point becomes infinite in value and is thus eliminated since $\delta$ in this case is zero. Note that all other $\delta$ values and thus, resistor ratios, are unaffected. Therefore, shifting of the sampling points by $\pi/16$ in the approximation of the signal $1-\cos\phi$ provides the benefit of allowing the elimination of one resistor from the weighting and summing network and a commensurate savings in the manufacturing cost of the circuit. It may be shown that for an nth order approximation of any signal with half-period symmetry, such as a sinusoidal signal, the ordinate generator for providing such approximation may be implemented with (n/2)–1 resistors if the sampling points are shifted by $\pi/n$ in the manner illustrated in FIG. 9. Owing to the cyclic characteristics of the Johnson counter, the resistors of the weighting and summing network may be rotated with respect to the outputs of the Johnson counter counter (e.g., $R_1$ connected to $Q_0$, $R_2$ connected to $Q_1$, $R_3$ connected to $Q_2$, etc.), the only difference being an inconsequential phase shift in the approximated signal.

Also tabulated in Table 2 are the resistor ratios derived by normalizing the values of $1/\delta$ to the lowest value thereof, with the first resistor ratio eliminated. It may be noted that the resistor ratios tabulated in Table 2 are symmetric about the middle ratio, which has a value of 1. It may be shown that for an n th order approximation of a sinusoidal signal, where n is divisible by 4, the resistor ratios may be expressed as follows:

$$R_{n/4} = 1, \quad (26)$$

$$R_{(n/4)\pm 1} = \frac{1}{\cos\left(\frac{2\pi}{n} \cdot 1\right)}, \quad (27)$$

$$R_{(n/4)\pm 2} = \frac{1}{\cos\left(\frac{2\pi}{n} \cdot 2\right)}, \quad (28)$$

-continued $$R_{(n/4)\pm m} = \frac{1}{\cos\left(\frac{2\pi}{n} \cdot m\right)}, \quad (29)$$

where m=1, 2, 3 ..., (n/4,)−1.

It may also be noted that the resistor ratios tabulated in Table 2 have a narrower spread of values than those tabulated in table 1. Using the shifted sampling points as in the example of FIG. 9 provides the additional benefit of a narrower spread in the values of the resistors of the weighting and summing network when the waveform being approximated has a decreasing slope magnitude near the axes of symmetry (e.g., at 0, $\pi$, $2\pi$, etc.). In general, it may be shown that for an n th order approximation of a sinusoidal signal in accordance with FIG. 9, the maximum resistor ratio may be expressed as 1/sin ($2\pi/n$).

The preceding explanation of the operation and design of the ordinate generator is intended to facilitate the understanding of the following description of a novel balanced mixer construction, which I have discovered, for mixing a discrete approximation of a periodic, continuous signal with a periodic digital signal, or for mixing two or more discrete approximations of periodic, continuous signals.

Figure 10:
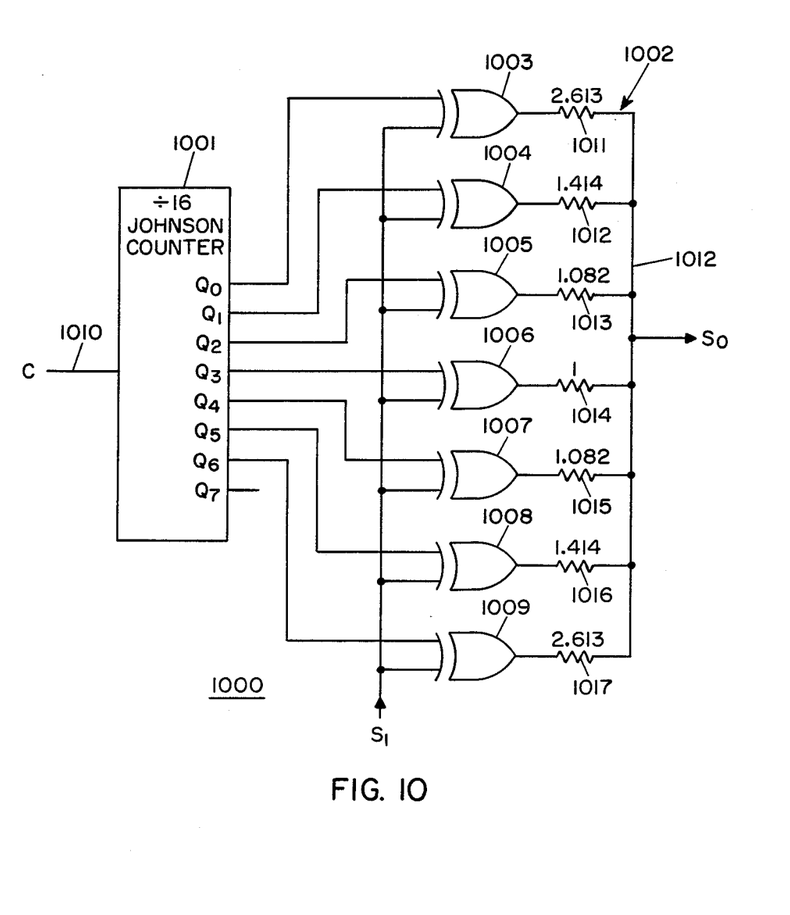
FIG. 10 is a schematic diagram of a mixer circuit, according to one embodiment of the present invention for mixing a 16th order approximation of a sinusoidal signal $1-\cos\omega_2 t$ with a periodic digital signal $S_1$.

Referring now to FIG. 10, there is shown a schematic diagram of a balanced mixer circuit 1000 according to an exemplary embodiment of the present invention. The circuit 1000, which mixes a 16th order approximation of a periodic, continuous signal with a periodic digital signal $S_1$, includes an eight-stage Johnson counter 1001, a resistive weighting and summing network 1002 and seven 2-input EXCLUSIVE OR gates 1003-1009. The Johnson counter 1001, which is identical to the one used in the ordinate generator of FIG. 6, has eight sequentially-ordered outputs $Q_0$-$Q_7$ and a clock input 1010. The resistive weighting and summing network 1002 includes seven resistors 1011-1017 corresponding to the first seven outputs $Q_0$-$Q_6$ of the Johnson counter 1001. Each of the resistors 1011-1017 have one end connected to a common node 1012, and the values of the resistors 1011-1017 are selected such that if the other end of each resistor is connected to its corresponding output of the Johnson counter 1001, there would be obtained an ordinate generator providing the discretely approximated signal to be mixed by the mixer circuit 1000. In the illustrative example of FIG. 10, the values of the resistors 1011-1017 are the resistor ratios taken from Table 2, because the discretely approximated signal being mixed is 1−−cos$\phi$, approximated in the manner illustrated in FIG. 9. Therefore, the weighting and summing network has seven resistors, which have been rotated upwards by one with respect to the outputs of the Johnson counter 1001. For reasons explained hereinabove, the output $Q_7$ of the Johnson counter is treated as being inoperative and therefore left unconnected.

Each of the EXCLUSIVE OR gates 1003-1009 has one of its inputs connected to a respective Johnson counter output and its output connected to the other end of the corresponding resistor of the weighting and summing network 1002. The other input of each of the EXCLUSIVE OR gates 1003-1009 is connected to receive the digital signal $S_1$ to be mixed by the mixer circuit 1000. The Johnson counter 1001 receives a digital clock signal C, having a period which is 1/16 th of the period of the discretely approximated signal. The mixer circuit 1000 provides a mixer product signal $S_0$ either as a voltage between the common node 1012 and ground (not shown in FIG. 10) or as a current between the common node and ground.

The mixer circuit 1000 of FIG. 10 performs essentially the same functions as that of FIG. 5, if the signal $S_2$ in FIG. 5 is a 16th order discrete approximation of 1−cos$\phi$ in the manner illustrated in FIG. 9. The mixer construction of FIG. 10, however, is highly advantageous in that it requires only digital components (i.e., a counter and EXCLUSIVE OR gates) and resistors. As explained above in connection with ordinate generators, the absolute values of the resistors 1011-1017 of the weighting and summing network 1002 are unimportant, since proper operation of the network 1002 depends only on the ratios between the resistors therein. However, the values of the resistors 1011-1017 may be scaled up or down by a common scale factor in order to meet design and fabrication requirements. Therefore, the mixer construction illustrated in FIG. 10 is ideally suited for implementation in integrated circuit form using known digital integrated circuit technologies.

The mixer circuit 1000 of FIG. 10 has the further advantage of providing a mixer product signal $S_0$ in which the desired component is well separate from the nearest harmonic component. The lowest order harmonic of the discretely approximated signal to be mixed by the mixer circuit 1000 is the 15th harmonic having a relative amplitude of 1/15. The 15th harmonic of the discretely approximated signal will mix with the 15th harmonic of the digital signal $S_1$, which also has a relative amplitude of 1/15. Consequently, the lowest order harmonic of the mixer product signal $S_0$ is the 15th harmonic, which has a relative amplitude of $1/(15)^2$. Therefore, a harmonically pure signal, which is tunable over a wide frequency range, may be extracted from the mixer product signal $S_0$ using a low-pass filter that is easily realized.

Figure 11:
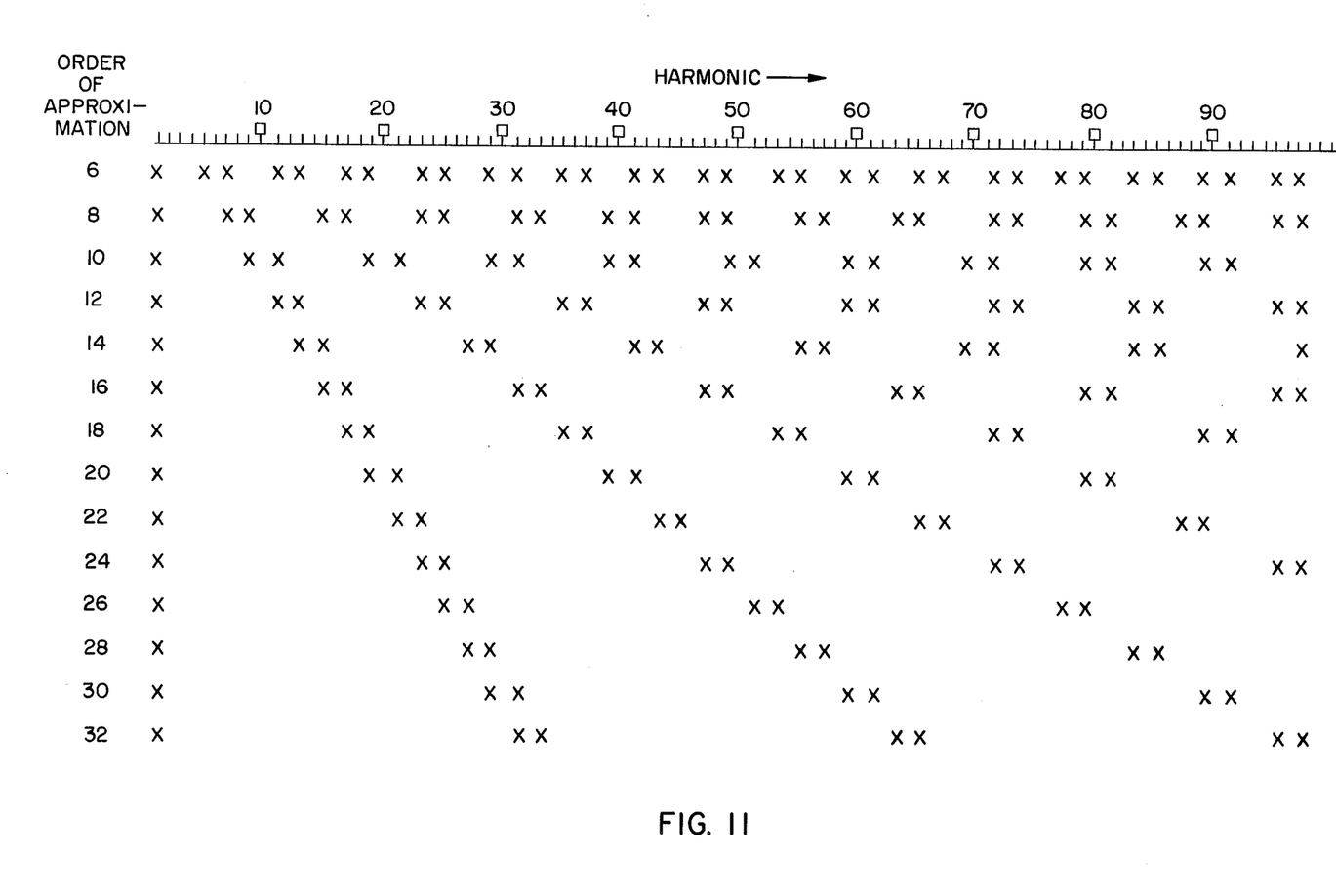
FIG. 11 graphically illustrates the positions of the harmonics for various orders of approximations of a sinusoidal signal.

Although the exemplary mixer circuit of FIG. 10 uses an eight stage Johnson counter 1001 and an appropriate weighting and summing network 1002 to provide mixing of a a 16th order approximation of the signal 1−cos$\phi$, the circuit may be constructed with a Johnson counter having more or fewer stages with corresponding changes in the number of weighting resistors and EXCLUSIVE OR gates use to obtain the mixing of $S_1$ with a different order approximation of a periodic, continuous signal. The specific signal being approximated is determined by the values of the weighting resistors, which are derived using the techniques described hereinabove in connection with the design of ordinate generators. For discrete approximations of sinusoidal signals, the separation between the fundamental component of the signal and the lowest harmonic thereof increases with the order of the approximation. Therefore, increasing the number of stages in the Johnson counter of the mixer circuit 1000 of FIG. 10 also results in a greater separation between the desired component and the nearest unwanted component of the mixer product signal $S_0$. In general, where the Johnson counter has m stages, the order of approximation is 2 m, and the lowest order harmonic of the approximated signal is 2 m−1 and has a relative amplitude of 1/(2 m−1). The fundamental and harmonics of various orders of approximation of a sinusoidal signal are illustrated graphically in FIG. 11. Each "x" in FIG. 11 represents a non-zero component for a given order of approximations. The magnitude of each components is 1/N, where N is the harmonic number of the component.

Figure 12:
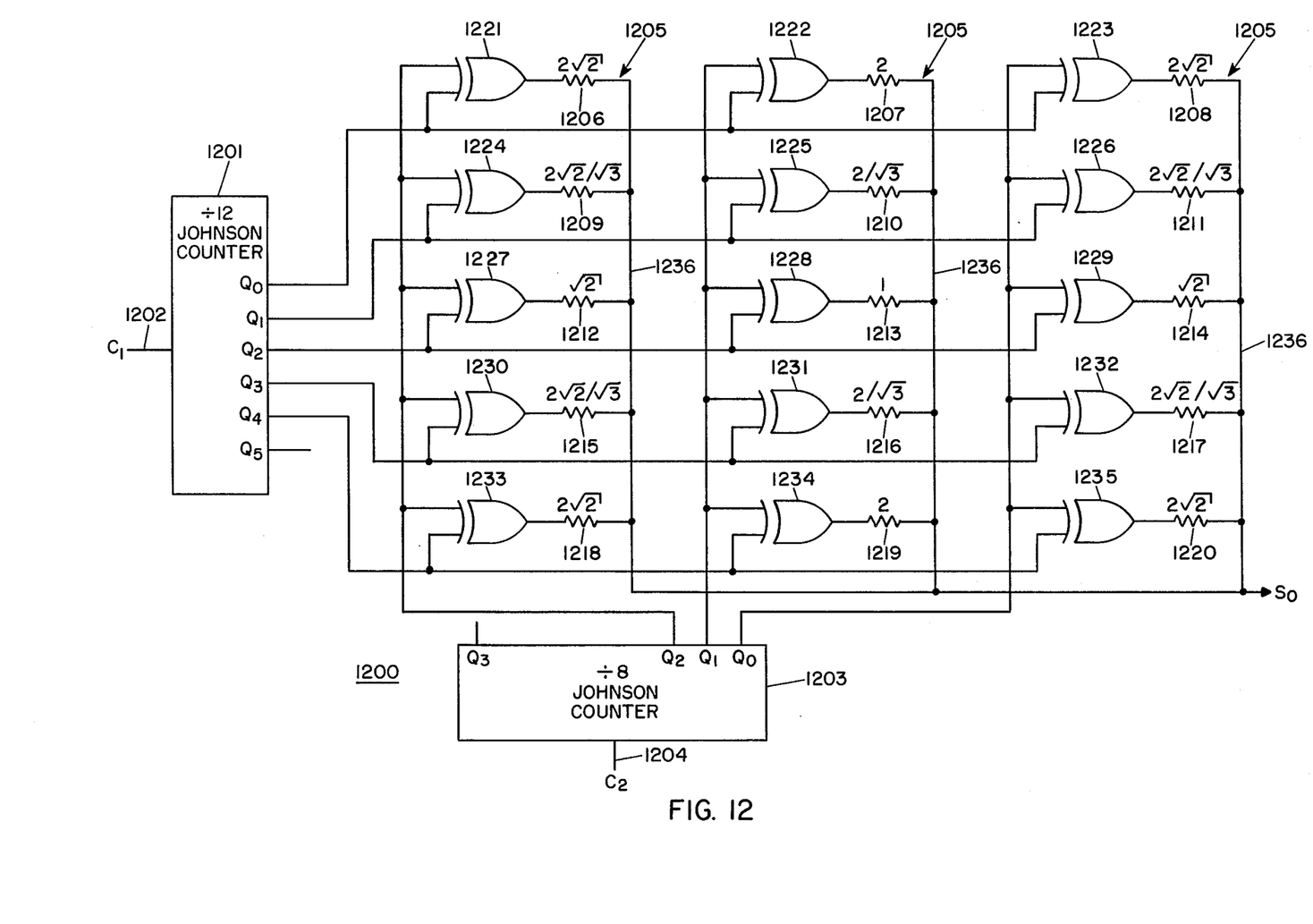
FIG. 12 is a schematic diagram of a mixer circuit according to another embodiment of the present invention for mixing a 12th order approximation of a sinusoidal signal $1-\cos\omega_2 t$ with an 8th order approximation of another sinusoidal signal $1-\cos\omega_1 t$.

Turning now to FIG. 12, there is shown a mixer circuit 1200 according to another exemplary embodiment of the present invention. The circuit 1200 is for mixing two discrete approximations of periodic, continuous signals and includes a six-stage Johnson counter 1201, having six sequentially ordered outputs $Q_0-Q_5$, a four-stage Johnson counter 1203, having four sequentially ordered outputs $Q_0-Q_3$, a weighting and summing network 1205 consisting of fifteen weighting resistors 1206–1220, and fifteen 2-input EXCLUSIVE OR gates 1221–1235. Each of the resistors 1206–1220 of the weighting and summing network 1205 corresponds to a different pair of outputs consisting of one output from each of the first five outputs $Q_0-Q_4$ of the Johnson counters 1201 and the first three outputs $Q_0-Q_2$ of the Johnson counter 1203. Each of the EXCLUSIVE OR gates 1221–1235 has its output connected to one terminal of a respective one of the resistors 1206–1220 and its inputs connected to the pair of outputs corresponding to the resistor. The other terminal of each resistor is connected to a common mode 1236.

Figure 13:
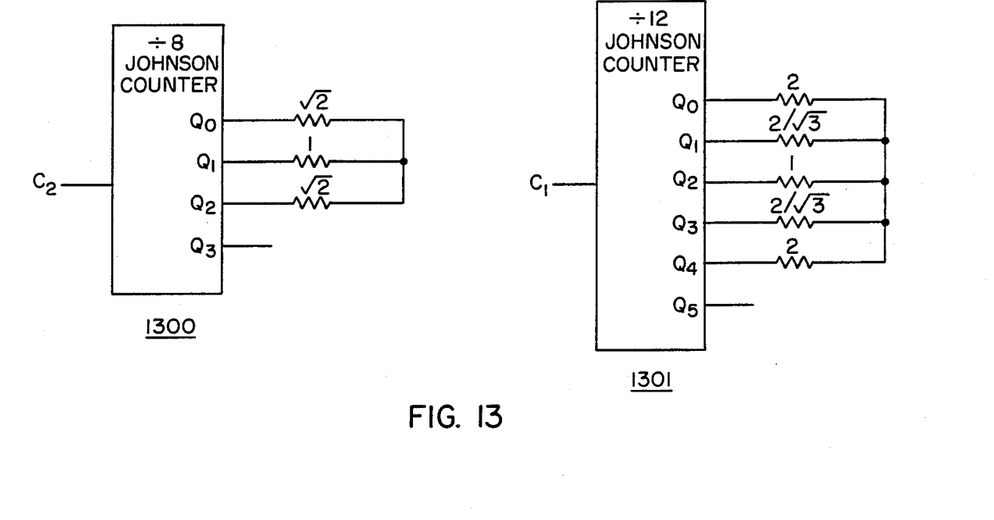
FIG. 13 schematically illustrates ordinate generators for the discretely approximated signals being mixed by the mixer circuit of FIG. 12.

The value of each of the resistors 1206–1220, disregarding a scale factor, is the product of the values of the weighting resistors that would be connected to the corresponding pair of outputs, if the Johnson counter 1201 and 1203 were used in ordinate generators for the discretely approximated signals to be mixed. In the present example, the signals to be mixed are a 12th order approximation of a sinusoidal signal of frequency $\omega_1$ and an eighth order approximations of a sinusoidal signal of frequency $\omega_2$. An eight ordinate generator 1300 and a twelve ordinate generator 1301 for providing the signals being mixed are shown in FIG. 13. The resistor ratios used in the ordinate generators 1300 and 1301 are computed using equations (26)–(29), by noting that for $n=8$ $$R_{\pm 1} = \frac{2}{\cos\left(\frac{2\pi}{8} \cdot 1\right)} = \sqrt{2} \tag{30}$$

and for $n=12$ $$R_{\pm 1} = \frac{1}{\cos\left(\frac{2\pi}{12} \cdot 1\right)} = \frac{2}{\sqrt{3}} \text{ and} \tag{31}$$

$$R_{\pm 2} = \frac{1}{\cos\left(\frac{2\pi}{12} \cdot 2\right)} = 2. \tag{32}$$

The weighting resistors in each of the ordinate generators 1300 and 1301 are rotated upward by one with respect to the outputs of the Johnson counters. For reasons explained hereinabove, the output $Q_3$ of the Johnson counter 1300 and the output $Q_5$ of the Johnson counter 1301 are treated as inoperative and are therefore left unconnected.

To derive the resistor ratios for the mixer circuit 1200 of FIG. 12, a column vector having as its elements the resistor ratios of the 12 ordinate generator 1301 is multiplied with a row vector having as its elements the resistor ratios of the eight ordinate generator 1300 in the following manner:

$$\begin{bmatrix} 2 \\ 2/\sqrt{3} \\ 1 \\ 2/\sqrt{3} \\ 2 \end{bmatrix} [\sqrt{2} \quad 1 \quad \sqrt{2}] = \tag{33}$$

$$\begin{bmatrix} 2\sqrt{2} & 2 & 2\sqrt{2} \\ 2\sqrt{2}/\sqrt{3} & 2/\sqrt{3} & 2\sqrt{2}/\sqrt{3} \\ \sqrt{2} & 1 & \sqrt{2} \\ 2\sqrt{2}/\sqrt{3} & 2/\sqrt{3} & 2\sqrt{2}/\sqrt{3} \\ 2\sqrt{2} & 2 & 2\sqrt{2} \end{bmatrix}.$$

The matrix of the right side of equation (33) contains an array of resistor ratios corresponding to the array of resistors 1206–1220 in the mixer circuit 1200 of FIG. 12.

The Johnson counters 1201 and 1203 in FIG. 12 receive clock signals $C_1$ and $C_2$, respectively, at clock inputs 1202 and 1204. Clock signal $C_1$ has a frequency that is twelve times greater than that of the 12th order approximation signal to be mixed, while clock signal $C_2$ has a frequency that is eight times greater than that of the 8th order approximation signal to be mixed.

The lengths of the Johnson counters 1201 and 1203 are made unequal for the purpose of eliminating close harmonics in the mixer product signal $S_0$. It may be noted from the graph of FIG. 11 that the lowest harmonic of the 8th order approximation of a sinusoidal signal to overlap with the corresponding harmonic of the 12th order approximation of a sinusoidal signal is the 23rd harmonic. Accordingly, the closest unwanted component in the mixer product signal $S_0$ from the mixer circuit 1200 of FIG. 12 is the 23rd harmonic having a relative amplitude of $1/(23)^2$, even though the lowest harmonic of the 8th and 12th order approximation signals are the 7th and 11th harmonic, respectively.

Figure 14:
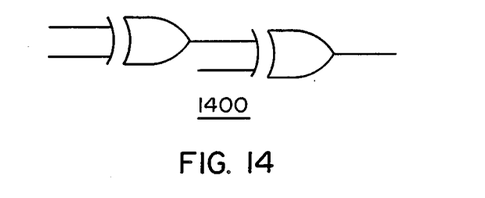
FIG. 14 is a schematic diagram of a two-level EXCLUSIVE OR gate suitable for use in a mixer according to the present invention for mixing three discretely approximated signals.

The mixer circuit 1200 of FIG. 12 may be expanded to mix more than two discretely approximated signals by adding more Johnson counters and using additional levels of EXCLUSIVE OR gating, such as the two level EXCLUSIVE OR gate 1400 illustrated in FIG. 14. The resistor values for such expanded circuits are derived in the same manner as for the mixer circuit of FIG. 12, i.e., by first deriving the resistor ratios of the ordinate generator for each of the signals to be mixed and taking the product of all different combinations of one resistor ratio from each ordinate generator.

Although the present invention has been described herein with reference to specific exemplary embodiments, various modifications and alterations may be made to the disclosed embodiments by one skilled in the art without departing from the spirit and scope of the invention, which as defined by the appended claims. For example, the signal weighting and summing networks used in the mixer circuits of the present invention may be implemented with signal weighting elements other than resistors, such as capacitors having appropriate ratios and connected in a known manner for charge summing. Furthermore, the counters used in the mixer circuits need not be Johnson counters but may be any counter circuit providing a set of discrete signals suitable for generating a discrete approximation of a periodic, continuous signal by appropriate weighting and summing of such discrete signals.

I claim:

1. A balanced mixer for multiplying a first and a second signal and forming the product thereof comprising:

output means for providing the product of the first and second signals;

counter means having an input for receiving a periodic digital clock signal and a plurality of sequentially-ordered outputs including a first output, providing respective periodic digital output signals having a frequency which is a predetermined fraction of the frequency of the clock signal, the digital output signals being suitable for generating a discrete approximation of the first signal by appropriately weighting and summing such digital output signals;

a plurality of signal weighting means, each one corresponding to a respective operative one of the outputs of the counter means and having a first and a second terminal, the first terminal of each signal weighting means being coupled in a signal summing arrangement to the output means, each signal weighting means having a value such that if the second terminals of the signal weighting means are coupled to the corresponding operative output of the counter means, the output means provides a discrete approximation of the first signal; and a plurality of EXCLUSIVE OR means each one having a first input coupled to a particular operative one of the outputs of the counter means, a second input coupled to receive the second signal and an output coupled to the second terminal of the signal weighting means corresponding to the particular operative one of the outputs of the counter means.

2. A balanced mixer according to claim 1, wherein the counter means comprises an N stage counter, each stage of the counter having an output providing an output signal of a frequency which is 1/2 N of the frequency of the clock signal.

3. A balanced mixer according to claim 2, wherein the N stage counter is a Johnson counter and the output signals are pulses having a pulsewidth equal to N/2 times the period of the clock signal, the pulses from each output, except the first output, being delayed from the pulses from its preceding output by the period of the clock signal.

4. A balanced mixer according to claim 3, wherein the first signal has a waveform with half-period symmetry, the plurality of signal weighting means comprise N−1 resistors corresponding to N−1 operative outputs of the Johnson counter, each resistor having a first and a second terminal, the first terminal of each resistor being coupled to the output means, and the plurality of EXCLUSIVE OR means comprises N−1 EXCLUSIVE OR gates, each one having one input connected to a particular one of the N−1 operative outputs of the Johnson counter, another input connected to receive the second signal and an output connected to the second terminal of the resistor corresponding to the particular one of the operative outputs.

5. A balanced mixer for multiplying a plurality of signals and forming the product thereof comprising:

output means for providing the product of the plurality of signals;

a plurality of counter means corresponding to the plurality of signals, each counter means having an input for receiving a respective periodic digital clock signal and a multiplicity of sequentially-ordered outputs, including a first output, providing respective periodic digital output signals having a frequency which is a predetermined fraction of the clock signal, the digital output signals being suitable for generating a discrete approximation of the corresponding one of the plurality of signals by appropriately weighting and summing such digital output signals;

a multiplicity of signal weighting means, each one corresponding to a particular one of different combinations of one operative output from each of the counter means and having a first and a second terminal, the first terminal being coupled in a signal summing arrangement to the output means, each signal weighting means having a value equal to the product of the values of individual signal weighting means that would be associated with the operative outputs of the particular one of the different combinations of operative outputs if each counter means and the individual signal weighting means associated with the outputs thereof formed an ordinate generator providing a discrete approximation of a respective one of the plurality of signals; and a multiplicity of EXCLUSIVE OR means, each one having a plurality of inputs coupled to respective ones, of the operative outputs of a specific one of the different combinations of operative outputs of the counter means and an output coupled to the second terminal of the signal weighting means corresponding to the specific one of the different combination of operative outputs.

6. A balanced mixer according to claim 5, wherein each of the counter means comprises a Johnson counter having a preselected number of stages, each stage having an output for providing a periodic pulse signal having a frequency equal to the clock signal frequency divided by twice the number of stages and having a pulse width equal to the period of the clock signal multiplied by one half the number of stages, the pulse signal from each output, except the first output, being delayed from the pulse signal from its preceding output by the period of the clock signal.

7. A balanced mixer according to claim 6, wherein one or more of the plurality of signals have waveforms with half-period symmetry and the number of operative outputs of each counter means corresponding to a signal with half-period symmetry is one less than the number of stages of the Johnson counter of the counter means.

8. A balanced mixer according to claim 6, wherein each of the EXCLUSIVE OR means comprises one or more EXCLUSIVE OR gates in a multiple level gating arrangement, in which the number of inputs is equal to the number of counter means in the mixer.

9. A balanced mixer according to claim 8, wherein the number of stages of each Johnson counter is selected to obtain a relatively large frequency separation between a desired component of the product of the plurality of signals and undesired components thereof.

* * * * *